US007245234B2

(12) United States Patent
Kim et al.

(10) Patent No.: US 7,245,234 B2
(45) Date of Patent: Jul. 17, 2007

(54) METHOD AND APPARATUS FOR ENCODING AND DECODING DIGITAL SIGNALS

(75) Inventors: Dohyung Kim, Hwaseong-si (KR); Junghoe Kim, Seoul (KR); Shihwa Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/334,524

(22) Filed: Jan. 19, 2006

(65) Prior Publication Data

US 2006/0158356 A1 Jul. 20, 2006

(30) Foreign Application Priority Data

Jan. 19, 2005 (KR) ..................... 10-2005-0005021

(51) Int. Cl.
*H03M 7/00* (2006.01)

(52) U.S. Cl. ........................................ 341/50; 704/500

(58) Field of Classification Search .................. 341/50, 341/65, 67, 106, 63; 704/219, 300, 500; 381/20; 370/464; 455/150
See application file for complete search history.

(56) References Cited

U.S. PATENT DOCUMENTS 4,016,370 A * 4/1977 Laoteppitaks et al. ...... 379/283
5,621,855 A 4/1997 Veldhuis et al. ............ 704/229
5,923,187 A * 7/1999 Maugars ...................... 326/86
2005/0004793 A1* 1/2005 Ojala et al. ................ 704/219
2006/0031075 A1* 2/2006 Oh et al. .................... 704/500

FOREIGN PATENT DOCUMENTS

KR 10-2004-0053501 6/2004
KR 10-2004-0073281 8/2004

OTHER PUBLICATIONS

Martin Dietz et al. "Spectral Band Replication, a Novel Approach in Audio Coding," 112th Convention of Audio Engineering Society, May 10, 2002, pp. 1-8.
Waal Van Der R G et al. "Subband Coding of Stereophonic Digital Audio Signals" ICASSP, New York, IEEE, US, vol. 4 Conf. 16, May 1991 pp. 3601-3604.
Korean Office Action Issued on Jun. 22, 2006, with respect to Korean Application No. 10-2005-005021, which corresponds to the above-reference application.

* cited by examiner

*Primary Examiner*—Peguy JeanPierre
(74) *Attorney, Agent, or Firm*—Staas & Halsey LLP

(57) ABSTRACT

Provided are method and apparatus for encoding and decoding multi-channel signals composed of a plurality of channels using a similarity between frequency bands and a similarity between channels. multi-channel digital signals are encoded/decoded using a similarity between frequency bands and a similarity between channels such that the size of signals to be transmitted to a decoding apparatus from an encoding apparatus can be reduced while maintaining predetermined sound quality and high-frequency signals can be effectively encoded and decoded to provide stable and natural sound quality.

41 Claims, 13 Drawing Sheets

METHOD AND APPARATUS FOR ENCODING AND DECODING DIGITAL SIGNALS

CROSS-REFERENCE TO RELATED APPLICATION

This application claims the benefit of Korean Patent Application No. 10-2005-0005021, filed on Jan. 19, 2005, in the Korean Intellectual Property Office, the disclosure of which is incorporated herein in its entirety by reference.

BACKGROUND OF THE INVENTION

1. Field of the Invention

The present invention relates to a method and apparatus for encoding and decoding multi-channel signals, and more particularly, to a method and apparatus for encoding a left-side channel signal into a first signal and encoding the combination of a left-side channel signal and a right-side channel signal into a second signal according to a similarity between channels for multi-channel signals and a decoding method and apparatus therefor.

2. Description of the Related Art

In digital audio transmission, audio signals to be transmitted are less affected by surrounding noise than conventional analog transmission and good sound quality like that obtained by using a compact disc (CD) can be obtained. However, as the amount of data to be transmitted increases, the capacity of a memory or the capacity of a transmission line should be increased accordingly.

To solve these problems, data compression technology is needed. In the case of audio compression technology, an original sound signal is compressed into a smaller amount of information, transmitted, and then decompressed such that the quality of the decompressed sound signal is nearly the same as that of the original sound signal. In other words, audio compression technology intends to play the same sound quality as the original sound and transmit a smaller amount of information.

In comparison with mono audio as an audio signal provided from one channel, stereo audio which is the combination of audio signals provided from a plurality of channels allows a listener to feel stereoscopic sound.

In a conventional method of processing audio signals such as perceptual noise substitution (PNS), audio signals can be effectively processed at a low bit rate such as 64 kbps/stereo using an MPEG-4 audio coding tool, but sound quality is degraded at a high bit rate. In the conventional method, in particular, when a transient audio signal is processed, sound quality is more degraded.

In addition, since a stereo audio signal is a combination of mono audio signals supplied from a plurality of channels, it is more difficult and expensive to store or transmit stereo audio signals. This is because, when mono audio signals supplied from the plurality of channels are encoded independently in each channel, the size of data increases by the number of channels. The size of data can be reduced by reducing a sampling rate or adopting lossy encoding. However, the sampling rate directly affects the sound quality, and lossy encoding may cause degradation of the sound quality.

As such, there is required a method of encoding and decoding multi-channel signals by which the sound quality of a digital signal and a transient signal having a high bit rate is not greatly degraded and redundant information between channels are effectively removed without affecting the sound quality of the digital signal and the transient signal.

SUMMARY OF THE INVENTION

Additional aspects and/or advantages of the invention will be set forth in part in the description which follows and, in part, will be apparent from the description, or may be learned by practice of the invention.

The present invention provides a method and apparatus for encoding and decoding multi-channel digital signals using a similarity between bands in which a bandwidth is not reduced even at a low bit rate and an audio signal is effectively processed.

The present invention also provides a method and apparatus for encoding multi-channel digital signals into a first signal having information about one-channel signal and a second signal having two-channel signal information including the channel signal according to a similarity between channels, so as to effectively remove redundant information between channels, and a decoding method and apparatus therefor.

According to an aspect of the present invention, there is provided a method of encoding digital signals composed of at least two channels, the method including: dividing the multi-channel digital signals into a predetermined number of frequency bands; detecting the most similar band among low-frequency bands less than a predetermined frequency, for each high-frequency band equal to or larger the predetermined frequency among the frequency bands; calculating a feature value from each of the high-frequency bands; performing a first operation using a first channel signal among the multi-channel signals to generate a first signal and performing a second operation using a combination of the first channel signal and a second channel signal among the multi-channel signals to generate a second signal; quantizing a signal that belongs to the low-frequency bands less than the predetermined frequency among the first and second signals and the calculated feature values of the high-frequency bands; and generating bitstreams using information about the detected similar low-frequency band, the quantized low-frequency band signal, and the quantized feature values of the high-frequency bands.

The detecting of the most similar band among low-frequency bands may include: calculating a similarity between the low-frequency bands and the high-frequency bands; detecting a low-frequency band having the largest similarity for each of the high-frequency bands; and checking whether a similarity between the detected low-frequency band and the high-frequency band is equal to or larger than a predetermined value and if the similarity is equal to or larger than the predetermined value, generating information about the detected low-frequency band. The method may further include, if the similarity between the detected low-frequency band and the high-frequency band is less than the predetermined value, generating information in which a similar low-frequency band does not exist.

The similarity may be a similarity between the shape of a curve formed by values of time domain samples that belong to the high-frequency band and the shape of a curve formed by values of time domain samples that belong to the low-frequency band.

The feature value may be at least one selected from a power of the high-frequency band and a scale factor.

The first signal may be the first channel signal, and the second signal may be a difference signal between the first and second channel signals.

The generating of the first and second signals may include: calculating a similarity between the first channel signal and the second channel signal; and if the similarity is equal to or larger than a predetermined value, encoding the multi-channel signals into a first signal and a second signal, wherein the first signal may be calculated using at least one of the first channel signal and the second predetermined channel signal, and the second signal may be calculated using a combination of the first and second channel signals.

The calculating of a similarity may include calculating one among ratios of power, a scale factor, and a masking threshold between the first channel signal and the second channel signal.

The encoding of the multi-channel signals may include, if the calculated ratio is within a predetermined range close to 1, encoding the multi-channel signals into a first signal and a second signal.

The method may further include allocating the number of quantized bits to the bands, wherein the quantizing may include quantizing a signal that belongs to the low-frequency bands among the first and second signals according to the number of allocated bits.

According to another aspect of the present invention, there is provided a method of decoding first and second input bitstreams into digital signals having first and second channel signals, the method including: extracting a quantized low-frequency band signal, a quantized feature value of each of high-frequency bands, and information about a low-frequency band similar to each of the high-frequency bands, from the first and second bitstreams; inverse quantizing the quantized low-frequency band signal and the quantized feature values of high-frequency bands; performing a first operation using a low-frequency band signal of the first inverse-quantized bitstream to generate a low-frequency band signal of a first channel and performing a second operation using a combination of low-frequency band signals of the first and second bitstreams to generate a low-frequency band signal of a second channel; and generating high-frequency band signals of first and second channels using the generated low-frequency band signals of the first and second channels, the inverse-quantized feature values of high-frequency bands, and the extracted information about the similar low-frequency band to each of the high-frequency bands.

The first-channel low-frequency band signal may be the inverse-quantized low-frequency band signal of the first bitstream, and the second-channel frequency band signal may be a difference signal between the inverse-quantized low-frequency band signals of the first and second bitstreams.

The generating of high-frequency band signals may include: with respect to each high-frequency band, copying an inverse-quantized signal of a low-frequency band similar to the high-frequency band; and converting the copied signal into a high-frequency band signal having the inverse-quantized feature value.

The generating of high-frequency band signals may include, if a similar low-frequency band corresponding to the high-frequency band does not exist, generating high-frequency band signals using only the inverse-quantized feature values of the high-frequency bands.

The feature value of the high-frequency band may be at least one of a power and a scale factor of the high-frequency band.

The inverse quantizing may include: extracting the number of bits allocated to quantize each frequency band from the bitstreams; and inverse quantizing the quantized low-frequency band signal using the extracted number of bits allocated.

According to another aspect of the present invention, there is provided an apparatus for encoding digital signals composed of at least two channels, the apparatus including: frequency band divider dividing the multi-channel digital signals into a predetermined number of frequency bands; a similarity analyzer detecting the most similar band among low-frequency bands less than a predetermined frequency, for each of high-frequency bands equal to or larger the predetermined frequency among the divided frequency bands, generating information about the detected similar low-frequency band, and calculating a feature value from each of the high-frequency bands; a left/side (LS)-encoder performing a first operation using a first channel signal among the multi-channel signals to generate a first signal and performing a second operation using a combination of the first channel signal and a second channel signal among the multi-channel signals to generate a second signal; a quantizer quantizing a signal that belongs to the low-frequency bands less than the predetermined frequency among the first and second signals and the feature values of the high-frequency bands; and a bitstream generator generating bitstreams using information about the similar low-frequency band, the quantized low-frequency band signal, and the quantized feature values of the high-frequency bands.

The similarity analyzer may include: a band similarity calculator calculating a similarity between the low-frequency bands and the high-frequency bands; a band detector detecting a low-frequency band having the largest similarity for each of the high-frequency bands; a band similarity determining unit determining whether a similarity between the detected low-frequency band and the high-frequency band is equal to or larger than a predetermined value; and a similar information generator, if the similarity is equal to or larger than the predetermined value, generating information about the detected low-frequency band, and if the similarity is less than the predetermined value, generating information in which a similar low-frequency band does not exist.

The similarity may be a similarity between the shape of a curve formed by values of time domain samples that belong to the high-frequency band and the shape of a curve formed by values of time domain samples that belong to the low-frequency band.

The feature value may be at least one selected from a power of the high-frequency band and a scale factor.

The first signal may be the first channel signal, and the second signal may be a difference signal between the first and second channel signals.

The apparatus may further include a channel similarity analyzer calculating a similarity between the first channel signal and the second channel signal, if the similarity is equal to or larger than a value, generating a signal used to operate the LS-encoder and outputting it.

The similarity between the first and second predetermined channel signals may be one among ratios of a power, a scale factor, and a masking threshold between the first channel signal and the second channel signal.

The apparatus may further include a quantization controller allocating the number of bits allocated to the bands, wherein the quantizer may quantize a signal that belongs to the low-frequency bands among the first and second signals according to the number of allocated bits.

According to another aspect of the present invention, there is provided an apparatus for decoding first and second input bitstreams into digital signals having first and second channel signals, the apparatus including: a bitstream interpreter extracting a quantized low-frequency band signal, a quantized feature value of each of high-frequency bands, and information about a low-frequency band similar to each of the high-frequency bands, from the first and second bitstreams; an inverse quantizer inverse quantizing the quantized low-frequency band signal and the quantized feature values of high-frequency bands; a left/side (LS)-decoder performing a first operation using a low-frequency band signal of the first inverse-quantized bitstream to generate a low-frequency band signal of a first channel and performing a second operation using a combination of low-frequency band signals of the first and second bitstreams to generate a low-frequency band signal of a second channel; and a high-frequency signal generator generating high-frequency band signals of first and second channels using the generated low-frequency band signals of the first and second channels, the inverse-quantized feature values of high-frequency bands, and the extracted information about the similar low-frequency band to each of the high-frequency bands.

The first-channel low-frequency band signal may be the same as the inverse-quantized low-frequency band signal of the first bitstream, and the second-channel frequency band signal may be a difference signal between the inverse-quantized low-frequency band signals of the first and second bitstreams.

The high-frequency signal generator may include: a signal copying unit receiving the inverse-quantized low-frequency band signal and information about a similar low-frequency band corresponding to the high-frequency band and copying a signal of a low-frequency band similar to each high-frequency band; and a signal converter receiving the copied signal and the inverse-quantized feature value of the high-frequency band and converting the copied signal into a high-frequency band signal having the inverse-quantized feature value with respect to each high-frequency band.

The high-frequency signal generator may generate high-frequency band signals using only the inverse-quantized feature values of the high-frequency bands if a similar low-frequency band corresponding to the high-frequency band does not exist, generating high-frequency band signals using only the inverse-quantized feature values of the high-frequency bands.

The feature value of the high-frequency band may be at least one of a power and a scale factor of the high-frequency band.

The bitstream interpreter may extract a quantized low-frequency band signal, a quantized feature value of each of high-frequency bands, and information about a frequency band similar to each of the high-frequency bands and the number of bits allocated to quantize each frequency band from the first and second bitstreams, and the inverse quantizer inverse quantizes the quantized low-frequency band signal using the number of bits allocated.

A program for executing the method of encoding and decoding multi-channel digital signals in a computer may be recorded on a computer readable medium.

According to another aspect of the present invention, there is provided a method of decoding bitstreams into digital signals having first and second channel signals, the method including: extracting a quantized low-frequency band signal, a quantized feature value of each of high-frequency bands, and information on a low-frequency band similar to each of the high-frequency bands, from the bitstreams; inverse quantizing the quantized low-frequency band signal and the quantized feature values of each high-frequency bands; decoding the inverse quantized low-frequency band signal to generate a low-frequency band signal of a first channel and a second channel; generating a low-frequency band signal of a second channel using a combination of low-frequency band signals of the first and second channel; an generating high-frequency band signals of first and second channels using the generated low-frequency band signals of the first and second channels, the inverse-quantized feature values of high-frequency bands, and the extracted information on the similar low-frequency band to each of the high-frequency bands.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
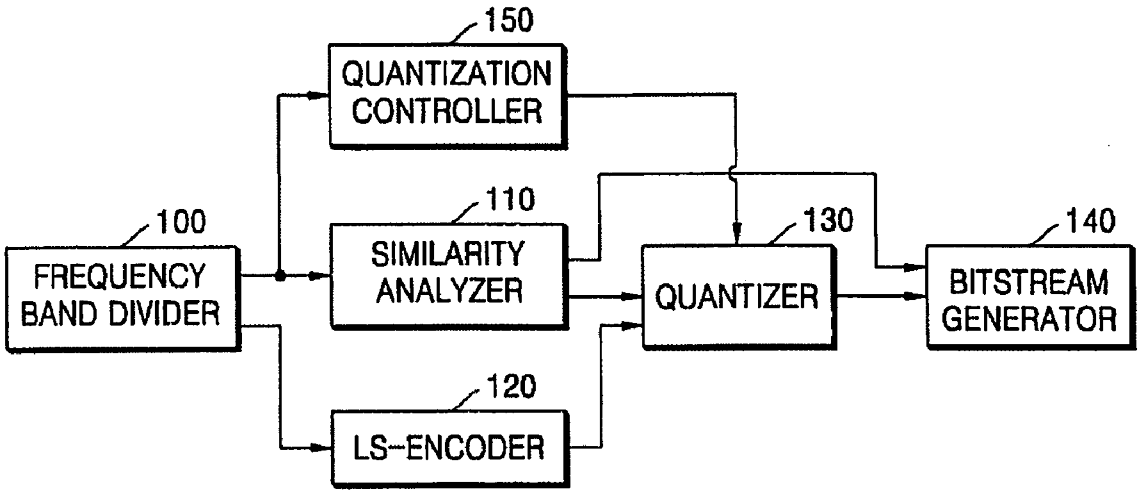
FIG. 1 is a block diagram of an apparatus for encoding multi-channel digital signals according to an embodiment of the present invention.

Reference will now be made in detail to the embodiments of the present invention, examples of which are illustrated in the accompanying drawings, wherein like reference numerals refer to the like elements throughout. The embodiments are described below to explain the present invention by referring to the figures.

Hereinafter, a method and apparatus for encoding digital signals according to the present invention will be described in detail with reference to the attached drawings.

FIG. 1 is a block diagram of an apparatus for encoding multi-channel digital signals according to an embodiment of the present invention. The apparatus of FIG. 1 includes a frequency band divider 100, a similarity analyzer 110, an LS-encoder 120, a quantizer 130, a bitstream generator 140, and a quantization controller 150.

Figure 10:
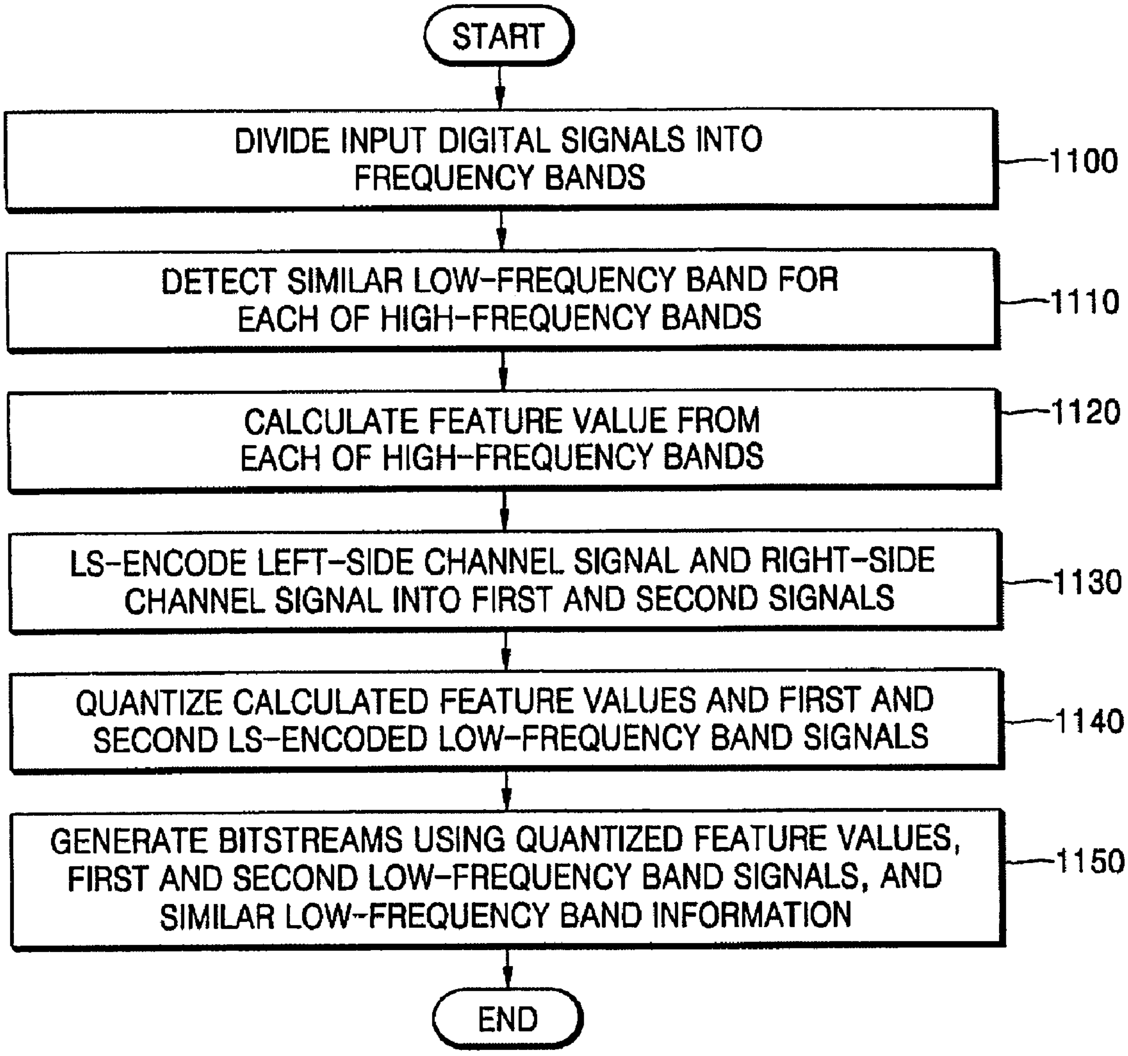
FIG. 10 is a flowchart illustrating a method of encoding multi-channel digital signals.

The operation of the apparatus for encoding multi-channel digital signals shown in FIG. 1 will now be described in association with the flowchart shown in FIG. 10 illustrating a method of encoding multi-channel digital signals.

In operation 1100, the frequency band divider 100 divides input digital signals in the time domain into frequency bands, which are divided into a predetermined number of frequency regions, and outputs them. According to another embodiment of the present invention, PCM-sampled signals are used as digital signals and converted into signals for each of a predetermined number of frequency bands using a subband filter. DCT, MDCT, FFT, etc., as well as the subband filter, may be used in dividing input digital signals into a frequency band.

In operation 1110, the similarity analyzer 110 detects a low-frequency band having a frequency equal to or smaller than the predetermined reference frequency that is most similar or relatively similar to the high-frequency band, for each of high-frequency bands having frequencies equal to or larger than the predetermined reference frequency and outputs information about the detected similar low-frequency band. The reference frequency may be changed by a user or set in advance. Information about the similar low-frequency band may be generated so that an index of the band corresponds to an index of the high-frequency band.

In operation 1120, the similarity analyzer 110 calculates a feature value from each of the high frequency bands. The feature value represents the size of sample values of each high-frequency band and may be an average power that belongs to the high-frequency band or scale factors of the high-frequency band.

Figure 5:
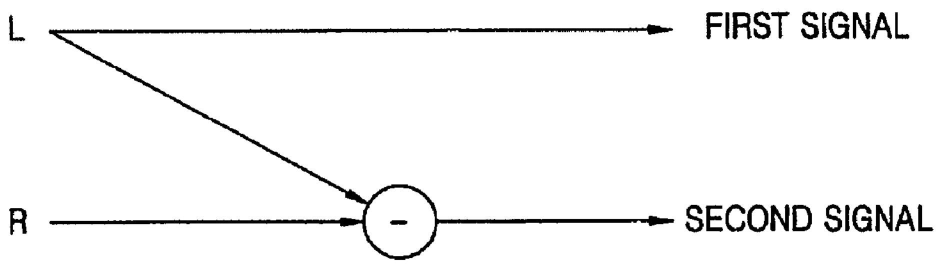
FIG. 5 illustrates a left/side (LS)-encoding operation according to another embodiment of the present invention.

In operation 1130, the LS-encoder 120 left/side (LS)-encodes multi-channel digital signals divided into frequency bands, for example, digital signals having a left-side channel signal and a right-side channel signal, into first and second signals. FIG. 5 illustrates the LS-encoding operation according to another embodiment of the present invention. A left-side channel signal L and a right-side channel signal R can be divided into first and second signals using equation 1.

$$\begin{bmatrix} \text{first signal} \\ \text{second signal} \end{bmatrix} = \begin{bmatrix} x & 0 \\ y & z \end{bmatrix} \begin{bmatrix} L \\ R \end{bmatrix} \tag{1}$$

where x, y, and z are constants. According to equation 1, the first signal is calculated using only the left-side channel signal L and has only information about the left-side channel signal L, and the second signal is calculated by the combination of the left-side channel signal L and the right-side channel signal R and has information about the left-side channel signal L and the right-side channel signal R. Specifically, the stereo digital signal is calculated by equation 2 and may be encoded into the first and second signals.

$$\begin{bmatrix} \text{first signal} \\ \text{second signal} \end{bmatrix} = \begin{bmatrix} 1 & 0 \\ 0.5 & -0.5 \end{bmatrix} \begin{bmatrix} L \\ R \end{bmatrix} \tag{2}$$

According to equation 2, the first signal encoded by the LS-encoder 120 is the same as the left-side channel signal L, and the second signal is obtained by dividing a difference signal between the left-side channel signal L and the right-side channel signal R by 2.

As described above, the LS-encoding operation has been described in an embodiment in which the left-side channel signal L and the right-side channel signal R are encoded into the first and second signals. However, even in case of digital signals on at least three channels, a signal of a first predetermined channel and a signal of a second predetermined channel among the at least three channels can be encoded into first and second signals using the above-described method.

The LS-encoder 120 may encode only low-frequency band signals among multi-channel digital signals, which are divided into frequency bands. In addition, the LS-encoding operation 1130 may be performed simultaneously with the operation of detecting a similar low-frequency band 1110 and calculating feature values 1120.

In operation 1140, the quantizer 130 quantizes the feature values of high-frequency bands received from the similarity analyzer 110 and quantizes low-frequency band signals such as first and second signals inputted from the LS-encoder 120 in each frequency band.

The quantization controller 150 determines numbers of bits allocated to quantize each of frequency bands, and the quantizer 130 quantizes each of frequency bands according to the number of allocated bits determined by the quantization controller 150.

The quantization controller 150 may analyze hearing sensitivity with respect to each of divided frequency band and determine the number of allocated bits according to the result of analysis.

According to an embodiment of the present invention, the quantization controller 150 may include a psychoacoustic model (not shown) and a bit allocating unit (not shown). The psychoacoustic model calculates a signal-to-mask ratio (SMR), which is a base for bit allocation in each frequency band, according to human hearing characteristics and outputs it. The bit allocating unit obtains the number of bits allocated to each frequency band from an SMR value received from the psychoacoustic model.

According to another embodiment of the present invention, the quantization controller 150 may include an allocated bit number extracting unit (not shown) and a lookup table (not shown). Numbers of allocated bits to quantize frequency bands are stored in the lookup table to correspond to addresses that indicate characteristics of each of frequency bands. A feature value of the frequency band may be average power of samples that belong to the frequency bands, a scale factor of the frequency band or a masking threshold of the frequency band.

The scale factor is a value of a sample having the largest absolute value, among samples that belong to each frequency band. The masking threshold is the maximum size of a signal that a human cannot feel even though the signal is audible due to interaction between audio signals. The masking threshold is a value related to a making phenomenon in which a certain signal among audio signals in psychoacoustic model usually used in audio signal encoding masks another signal by interference and a human cannot feel even though the signal is audible.

The allocated bit number extracting unit calculates a feature value of an input signal in each frequency band as an address value and extracts the number of allocated bits which correspond to the calculated address value. Numbers of allocated bits stored in the lookup table may be stored in advance according to the feature value of the frequency band based on the psychoacoustic model so that quantization can be properly performed.

According to another embodiment of the present invention, the quantization controller 150 may include a plurality of lookup tables (not shown), a lookup table selecting unit (not shown), and an allocated bit number extracting unit (not shown). Numbers of allocated bits that vary according to characteristics of input digital signals are stored in the plurality of lookup tables. The lookup table selecting unit calculates the characteristics of the input digital signals and selects a lookup table which is suitable for the calculated characteristics, from the plurality of lookup tables. The allocated bit number extracting unit calculates the feature value of a digital signal in each frequency band as an address value and extracts the number of allocated bits which correspond to the calculated address value, from the selected lookup table. The characteristics of the digital signals may be the distribution of samples divided into frequency bands.

In operation 1150, the bitstream generator 140 generates the quantized low-frequency band signals, feature values of the high-frequency bands calculated by the similarity analyzer 110, and similar low-frequency band information which corresponds to each high-frequency band generated by the similarity analyzer 110, as bitstreams and transmits them. The bitstream generator 140 may lossless encode input signals and bit pack them, and then convert the result of bit packing into a bitstream format. The bitstream generator 140 may use Huffman encoding for lossless encoding.

Figure 2:
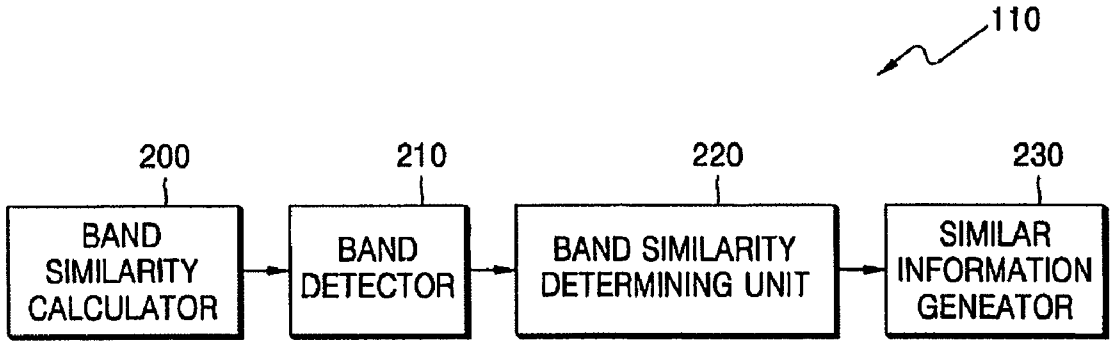
FIG. 2 is a block diagram illustrating a similarity analyzer of FIG. 1 according to another embodiment of the present invention.
Figure 11:
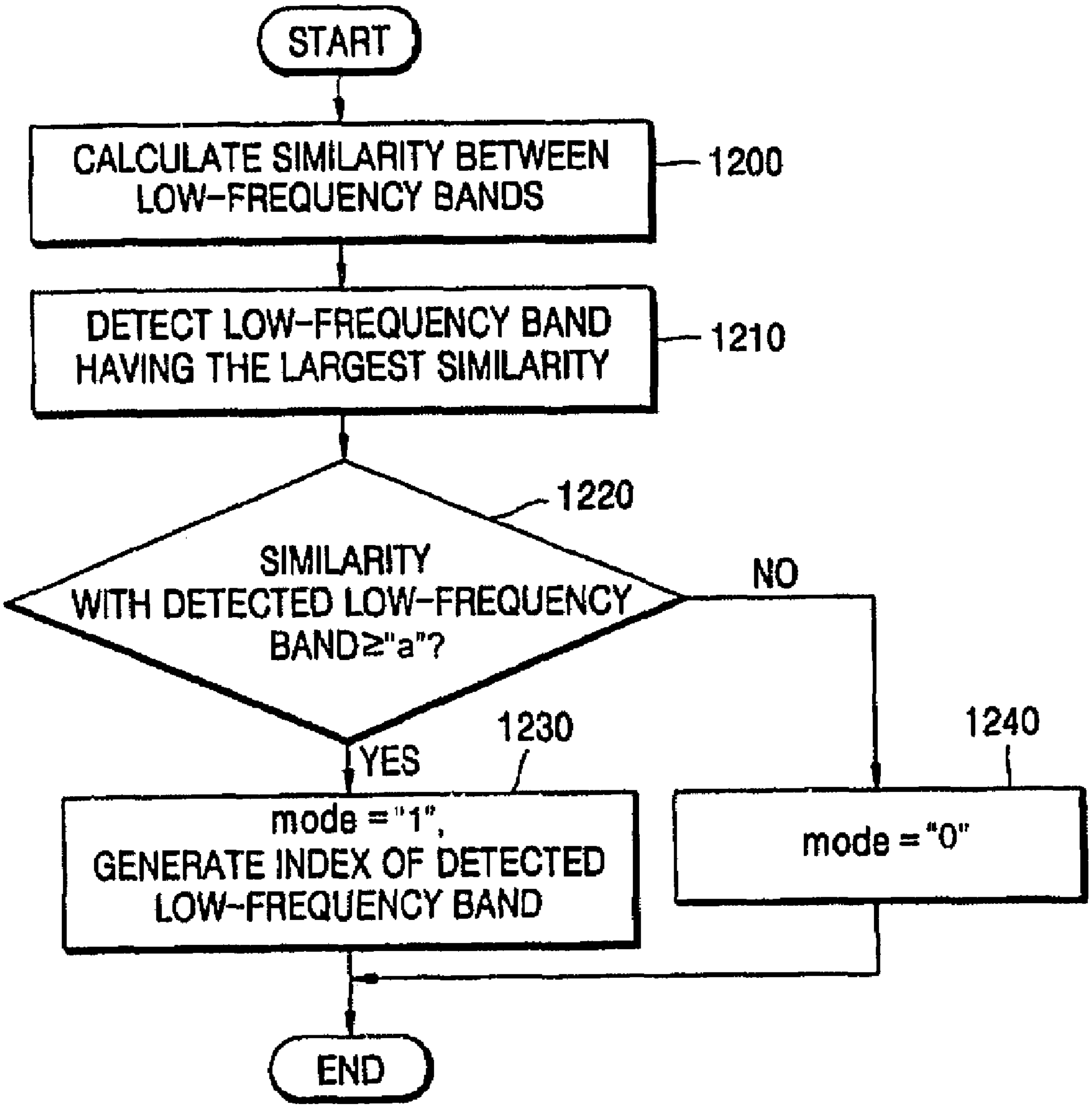
FIG. 11 is a flowchart illustrating an operation of detecting a similar low-frequency band of FIG. 10 according to another embodiment of the present invention.

FIG. 2 is a block diagram illustrating the similarity analyzer 110 of FIG. 1 according to another embodiment of the present invention. The similarity analyzer 110 includes a band similarity calculator 200, a band detector 210, a band similarity determining unit 220, and a similar information generator 230. The operation of the similarity analyzer 110 of FIG. 2 will now be described in association with the flowchart shown in FIG. 11.

In operation 1200, the band similarity calculator 200 calculates a similarity between all low-frequency bands from each high-frequency band. The band similarity calculator 200 may indicate a similarity in which the shape of a curve formed by values of time domain samples that belong to the high-frequency band and the shape of a curve formed by values of time domain samples that belong to the low-frequency band are similar to each other.

Figure 3A:
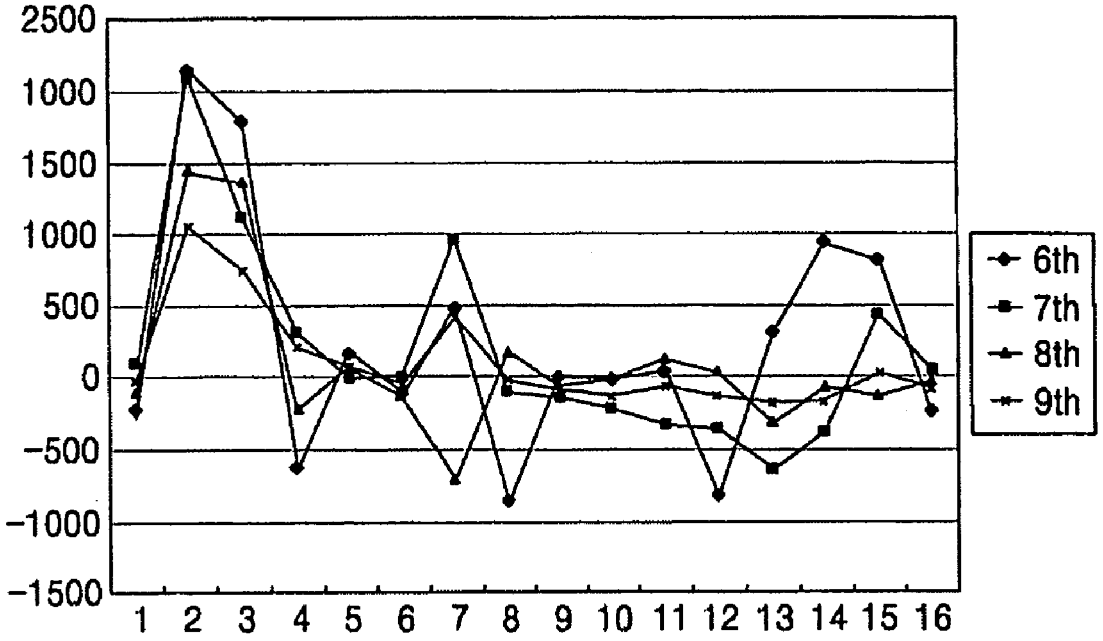
FIGS. 3A through 3D are graphs illustrating signal values for explaining the operation of calculating a similarity between all low-frequency bands according to another embodiment of the present invention.
Figure 3B:
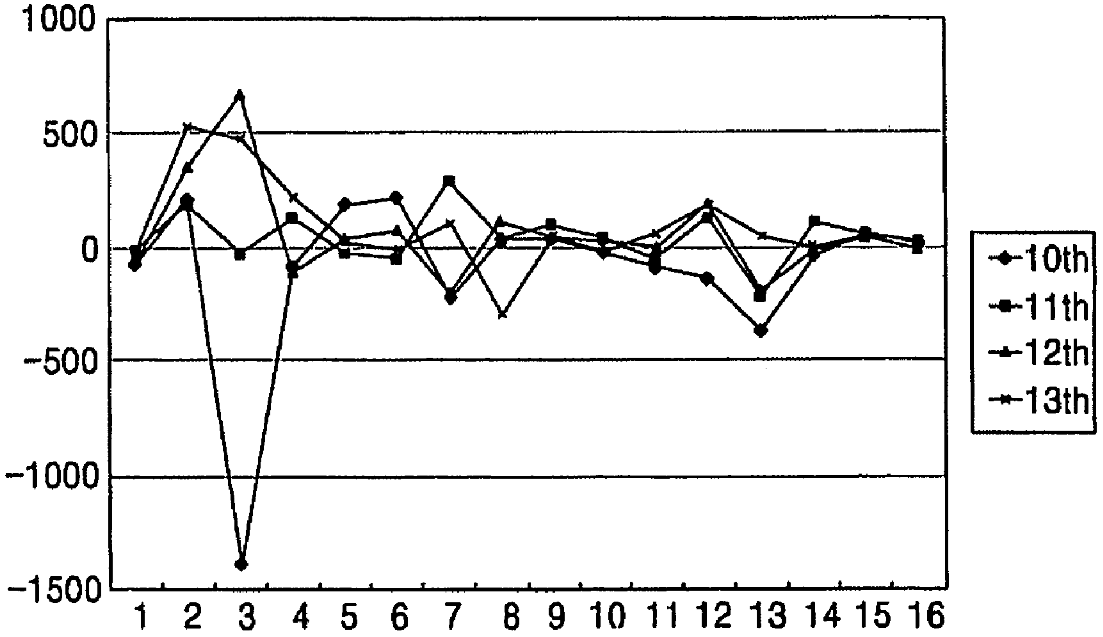
Figure 3C:
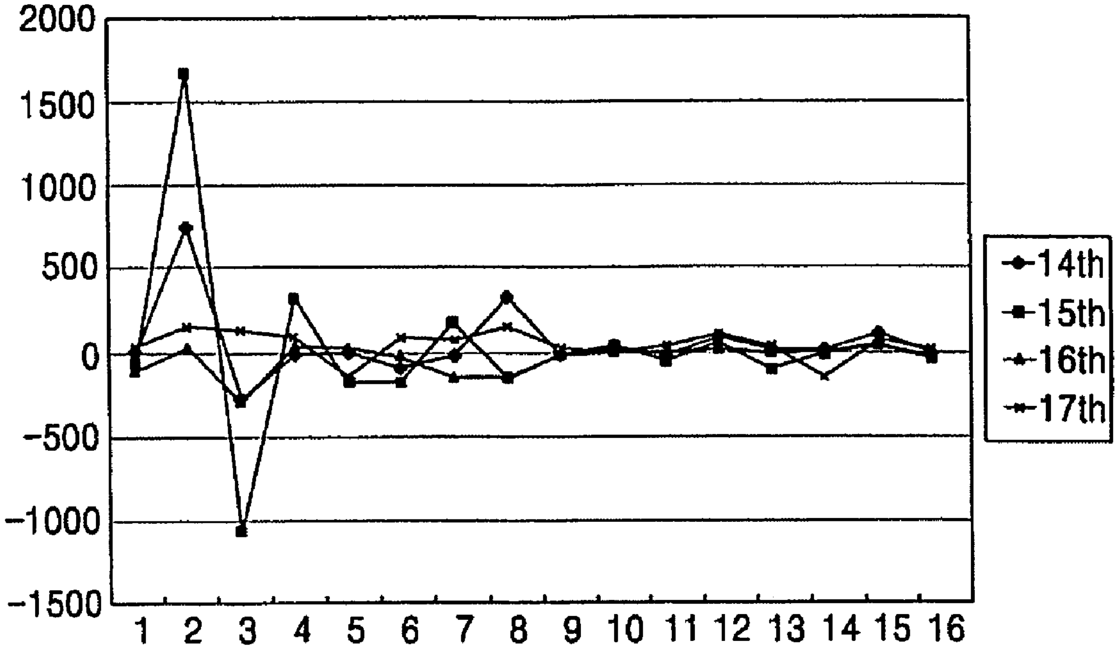
Figure 3D:
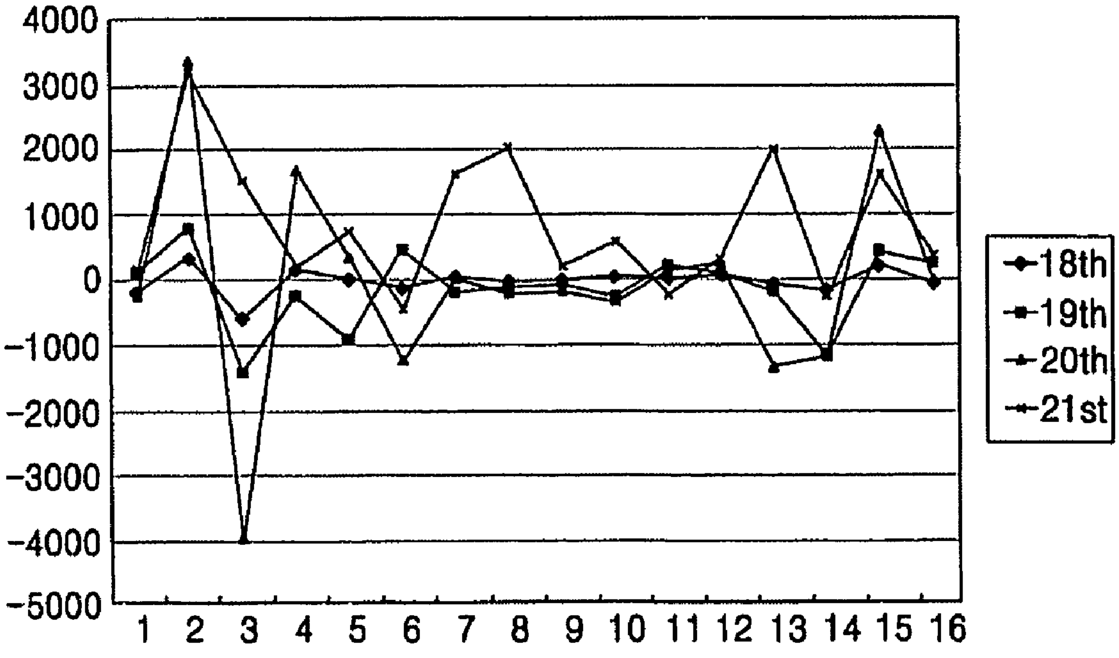

FIGS. 3A through 3D are graphs illustrating values of samples that belong to frequency bands, for explaining the operation of calculating a similarity between all low-frequency bands according to another embodiment of the present invention. FIG. 3A illustrates values of samples that belong to $6^{th}$ to $9^{th}$ bands, FIG. 3B illustrates values of samples that belong to $10^{th}$ to $13^{th}$ bands, FIG. 3C illustrates values of samples that belong to $14^{th}$ to $17^{th}$ bands, and FIG. 3D illustrate values of samples that belong to $18^{th}$ to $21^{st}$ bands. In each of the drawings, the horizontal axis represents time and the vertical axis represents sample values. 1 to 16 shown in each of FIGS. 3A through 3D represent indices in the time domain.

Assuming that $10^{th}$ or more frequency bands shown in FIG. 3B are high-frequency bands, the shape of a curve formed by samples that belong to a $14^{th}$ band of FIG. 3C among high-frequency bands is very similar to the shape of a curve formed by samples that belong to a $7^{th}$ band of FIG. 3A among low-frequency bands. In this case, a similarity between the $7^{th}$ band as the high-frequency band and the $14^{th}$ band as the low-frequency band is high.

A similarity between the high-frequency band and the low-frequency band may be calculated using equation 3.

$$cor = \frac{abs\left(\sum_{i=0}^{I-1}(samp[sb_1][i]\cdot samp[sb_2][i])\right)}{\sqrt{\sum_{i=0}^{I-1}(samp[sb_1[i]\cdot samp[sb_1][i])\sum_{i=0}^{I-1}(samp[sb_2][i]\cdot samp[sb_2][i])}} \tag{3}$$

where abs( ) is an absolute value of ( ), $sb_1$ is an index of the low-frequency band and one selected from 0 to k−1, and k is the number of the low-frequency-bands. Said $sb_2$ is an index of the high-frequency band and I is the number of time domain samples that belong to the low-frequency band and high-frequency bands. In addition, $samp[sb_1][i]$ is an i-th time domain sample placed in an $sb_1$-th low-frequency band, and $samp[sb_2][i]$ is an i-th time domain sample placed in an $sb_2$-th high-frequency band.

In operation 1210, the band detector 210 receives a similarity between a high-frequency band and a low-frequency band from the band similarity calculator 200 and detects a low-frequency band having the largest, or relatively high, similarity with respect to each high-frequency band.

In operation 1220, the band similarity determining unit 220 determines whether a similarity between each high-frequency band and the detected low-frequency band is equal to or larger than a predetermined similarity value "a", which value is 0.4, for example and outputs the result of determination. When the similarity is equal to or larger than "a", in operation 1230, the similar information generator 230 generates information in which a similar low-frequency band to the high-frequency band exists and generates similar low-frequency band information so that an index of the high-frequency band corresponds to an index of the detected similar low-frequency band. When the similarity is less than "a", in operation 1240, the similar information generator 230 generates information in which a similar low-frequency band to the high-frequency band does not exist. Information about whether the similar low-frequency band exists may be generated so that a mode bit of 1 bit is set in each high-frequency band, if the similar low-frequency band exists, the mode bit is generated as "1" and if the similar low-frequency band does not exist, the mode bit is generated as "0".

Figure 4:
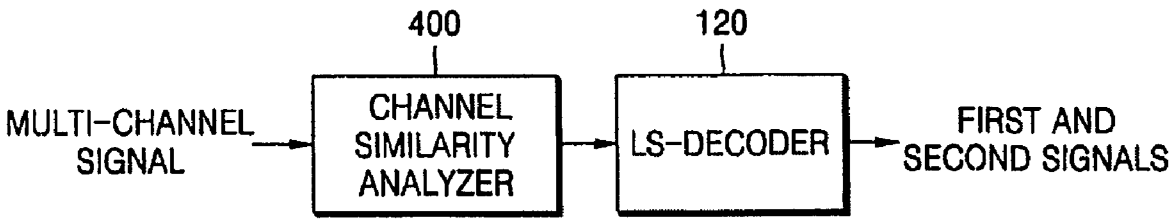
FIG. 4 is a block diagram illustrating the operation of an LS-encoder of FIG. 1 according to another embodiment of the present invention.

FIG. 4 is a block diagram illustrating the operation of the LS-encoder 120 of FIG. 1 according to another embodiment of the present invention. Referring to FIG. 4, the LS-encoder 120 may further include a channel similarity analyzer 400.

Figure 12:
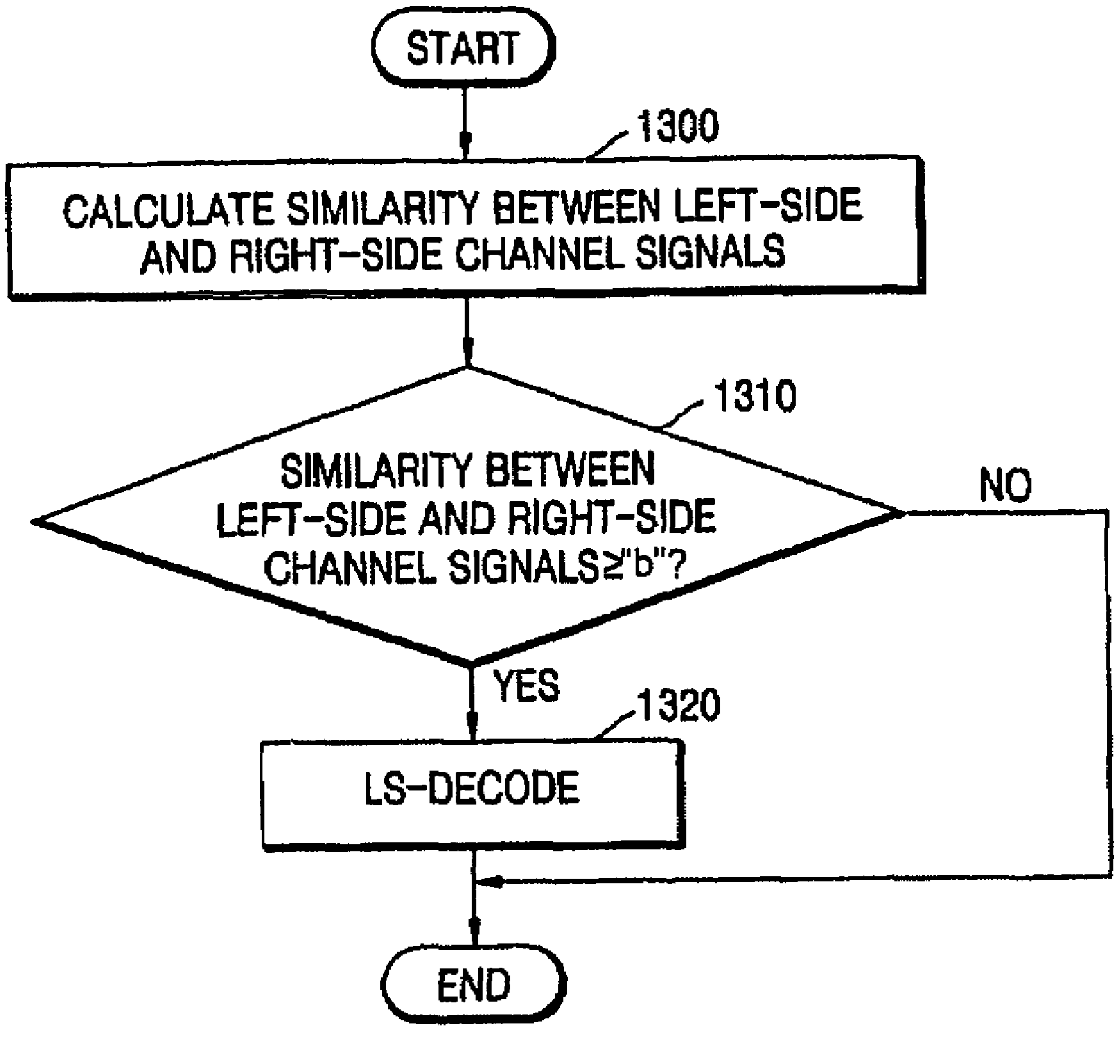
FIG. 12 is a flowchart illustrating an LS-encoding operation of FIG. 10 according to another embodiment of the present invention.

The operation of the LS-encoder 120 of FIG. 4 will now be described in association with the flowchart shown in FIG. 12.

In operation 1300, the channel similarity analyzer 400 calculates a similarity between a left-side channel signal and a right-side channel signal. The channel similarity analyzer 400 may calculate a similarity between the left-side channel signal and the right-side channel signal in each frequency band divided by the frequency band divider 100.

A similarity between the left-side channel signal and the right-side channel signal may be calculated by a ratio of average power between the two channel signals, a ratio of a scale factor or a ratio of a masking threshold. The average power is average power between samples that belong to each frequency band of the two channel signals.

As for the calculated ratio of average power between the left-side channel signal and the right-side channel signal, the calculated ratio of the scale factor or the calculated ratio of the masking threshold becomes closer to "1" and a similarity between the two channels is high.

In operation 1310, the channel similarity analyzer 400 determines whether the calculated similarity is equal to or larger than a predetermined channel similarity value "b", which value is 0.5, for example, and if the calculated similarity is equal to or larger than "b", in operation 1320, the LS-encoder 120 generates a signal used in performing LS-encoding on the left-side and right-side channel signals and outputs it. If the calculated ratio of average power between the left-side channel signal and the right-side channel signal, the calculated ratio of the scale factor or the calculated ratio of the masking threshold is within a predetermined range close to "1", the LS-encoder 120 performs encoding. When a value of the calculated ratio is within a range of 1±0.1, that is, when the calculated ratio is between 0.9 and 1.1, the LS-encoder 120 performs encoding. When the calculated similarity is less than the predetermined channel similarity value "b", the LS-encoder 120 does not perform LS-encoding on the left-side and right-side channel signals but outputs the signals in each channel without any change so that the signals are processed in each channel in a subsequent encoding operation.

Figure 6:
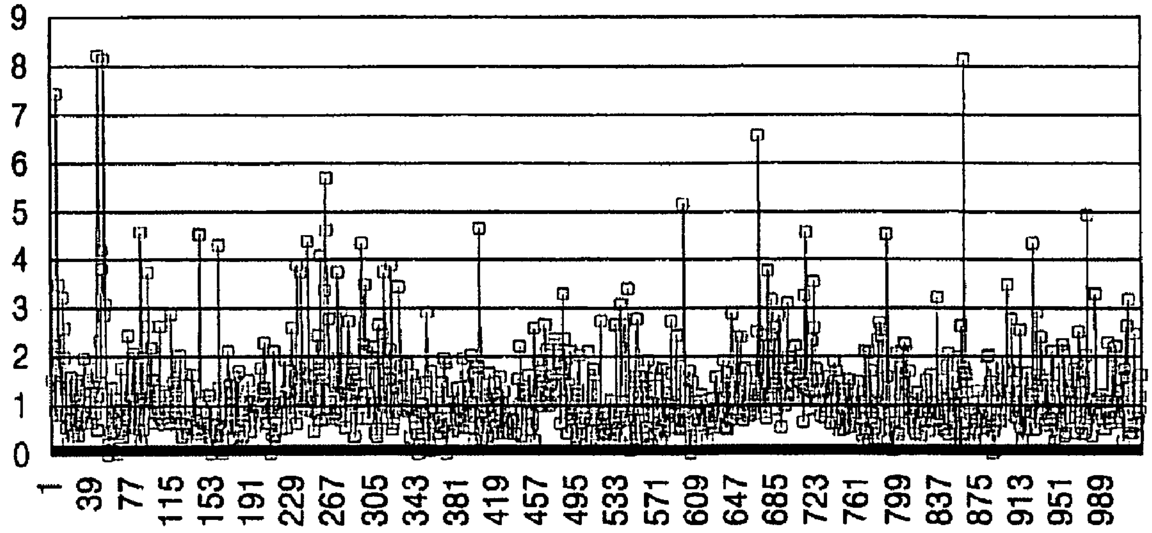
FIG. 6 is a graph illustrating the ratio of average power between a left-side channel signal and a right-side channel signal according to an embodiment of the present invention.

FIG. 6 is a graph illustrating the ratio of average power between a left-side channel signal and a right-side channel signal according to an embodiment of the present invention. Since the value of the ratio of average power between two channels shown in FIG. 6 is close to 0 to 8 distant from 1, a similarity between the left-side channel signal and the right-side channel signal is low. Since many stereo components are contained in the stereo signal, the left-side channel signal and the right-side channel signal may be quantized in each channel.

Figure 7:
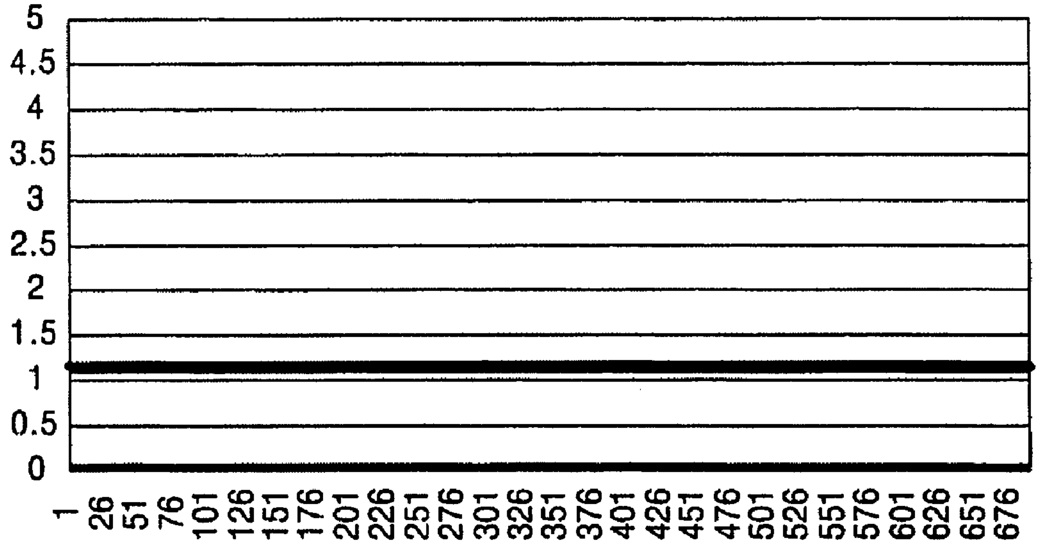
FIG. 7 is a graph illustrating the ratio of average power between a left-side channel signal and a right-side channel signal according to another embodiment of the present invention.

FIG. 7 is a graph illustrating the ratio of average power between a left-side channel signal and a right-side channel signal according to another embodiment of the present invention. Since the value of the ratio of average power between two channels shown in FIG. 7 is close to 1, a similarity between the left-side channel signal and the right-side channel signal is high. Since many mono components are contained in the stereo signal, the left-side channel signal and the right-side channel signal may be encoded by the LS-encoding method into a first signal and a second signal, redundant components therebetween may be removed and then, the signals may be quantized.

Figure 8:
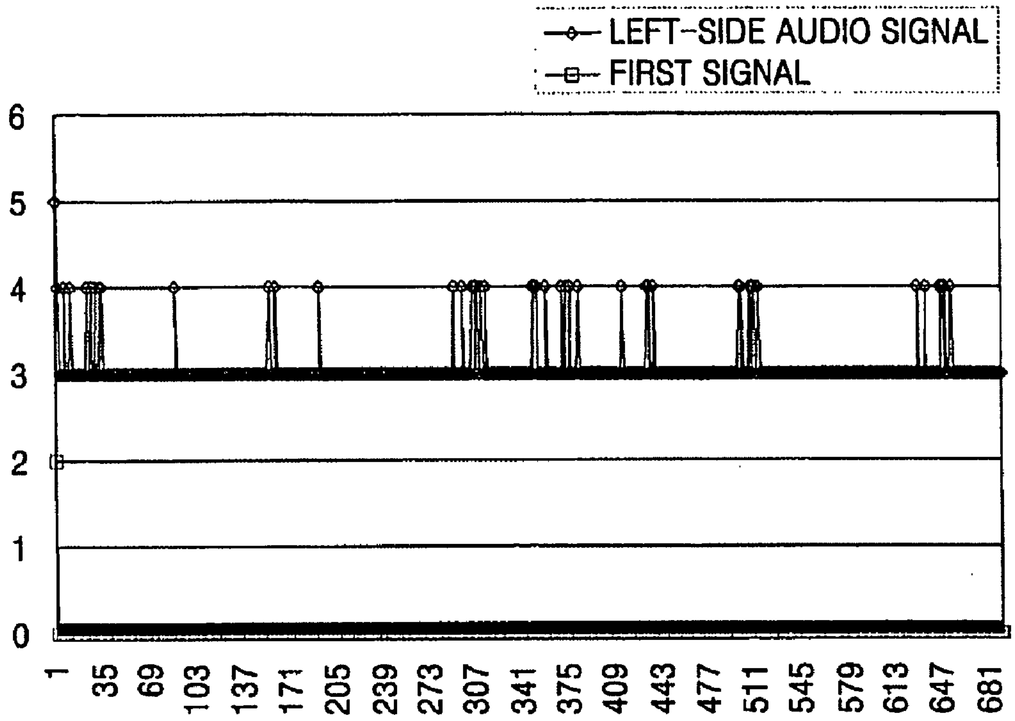
FIG. 8 is a graph illustrating a change in a distribution of a left-side channel signal and a first signal as a result of LS-encoding.

FIG. 8 is a graph illustrating a change in a distribution of a left-side channel signal and a first signal as a result of LS-encoding. Referring to FIG. 8, SR_Index of the left-side channel signal and the first signal, respectively, is calculated in one frequency band. The larger the calculated SR_Index, the smaller the ratio of a signal of a corresponding frequency band with respect to all of signals. Thus, when a left-side channel signal is LS-encoded into a first signal, the ratio of a corresponding frequency band increases.

Figure 9:
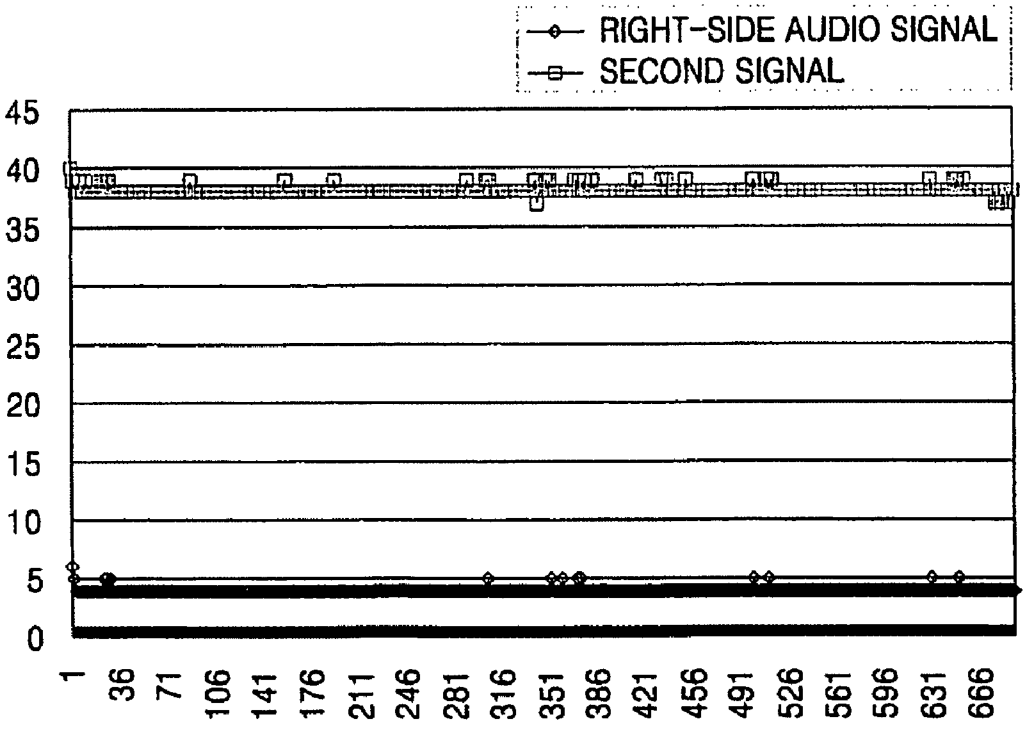
FIG. 9 is a graph illustrating a change in a distribution of a right-side channel signal and a second signal as a result of LS-encoding.

FIG. 9 is a graph illustrating a change in a distribution of a right-side channel signal and a second signal as a result of LS-encoding. Referring to FIG. 8, SR_Index of the right-side channel signal and the second signal, respectively, is calculated in one frequency band. When, the combination of the right-side channel signal and the left-side channel signal is LS-encoded into the second signal, the ratio of a corresponding frequency band of the second signal is very smaller than the right-side channel signal.

Referring to FIGS. 8 and 9, when the similarity between the left-side channel signal and the right-side channel signal is large, LS-encoding on the left-side channel signal and the right-side channel signal is performed so that redundant information between channels is removed and the number of bits of signals can be reduced.

Figure 13:
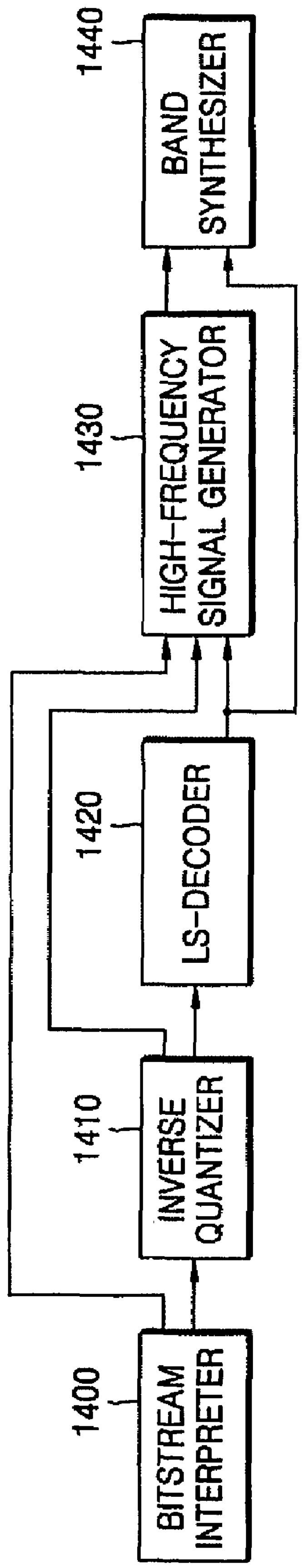
FIG. 13 is a block diagram of an apparatus for decoding multi-channel digital signals according to another embodiment of the present invention.

A method and apparatus for decoding digital signals according to the present invention will now be described with reference to the attached drawings. FIG. 13 is a block diagram of an apparatus for decoding multi-channel digital signals according to another embodiment of the present invention. The apparatus of FIG. 13 includes a bitstream interpreter 1400, an inverse quantizer 1410, an LS-decoder 1420, a high-frequency signal generator 1430, and a band synthesizer 1440.

Figure 15:
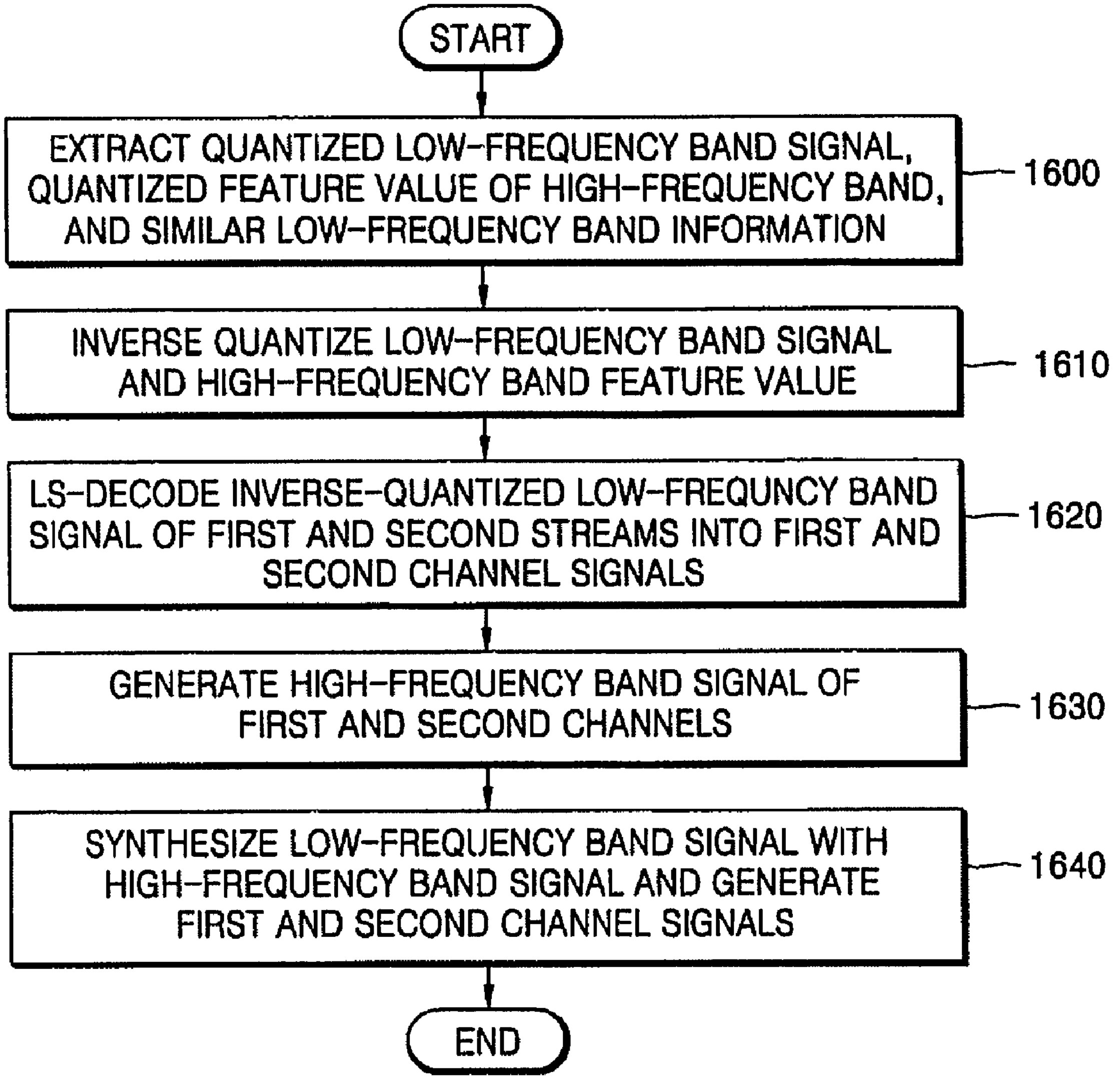
FIG. 15 is a flowchart illustrating a method of decoding multi-channel digital signals according to another embodiment of the present invention.

The operation of the apparatus for decoding multi-channel digital signals will now be described in association with the flowchart shown in FIG. 15 illustrating a method of decoding multi-channel digital signals.

In operation 1600, the bitstream interpreter 1400 receives a plurality of bitstreams in which information on multi-channel digital signals is contained and extracts similar low-frequency band information which corresponds to quantized low-frequency band signals, quantized feature values of high-frequency bands and high-frequency bands, from each of the bitstreams. When information on the number of allocated bits to quantize each of frequency bands is contained in the bitstreams, the bitstream interpreter 1400 may extract the information on the number of allocated bits from the bitstreams.

In operation 1610, the inverse quantizer 1410 inverse quantizes the extracted quantized low-frequency band signals and quantized feature values of high-frequency bands. When the information on the number of allocated bits is extracted from the bitstream, the inverse quantizer 1410 may inverse quantize the quantized low-frequency band signal using the number of allocated bits of each of the frequency bands.

In operation 1620, the LS-decoder 1420 receives the inverse-quantized low-frequency band signals of each of the bitstreams from the inverse quantizer 1410 and LS-decodes the low-frequency band signals into multi-channel low-frequency signals.

A method of decoding first and second bitstream signals into a left-side channel signal and a right-side channel signal as an example of the LS-decoding method will now be described.

When the first and second bitstream signals are LS-encoded using equation 1, the LS-decoder 1420 decodes first and second bitstream signals into the left-side channel signal and the right-side channel signal using equation 4.

$$\begin{bmatrix} L \\ R \end{bmatrix} = \frac{1}{xz} \begin{bmatrix} z & 0 \\ -y & x \end{bmatrix} \begin{bmatrix} \text{first signal} \\ \text{second signal} \end{bmatrix} \quad (4)$$

When the first and second bitstream signals are LS-encoded using equation 2, the LS-decoder 1420 decodes first and second bitstream signals into the left-side channel signal and the right-side channel signal using equation 5.

$$\begin{bmatrix} L \\ R \end{bmatrix} = \frac{1}{xz} \begin{bmatrix} 1 & 0 \\ 1 & -2 \end{bmatrix} \begin{bmatrix} \text{first signal} \\ \text{second signal} \end{bmatrix} \quad (5)$$

Even when at least three bitstreams are inputted, a first predetermined bitstream signal and a second predetermined bitstream signal among the at least three bitstreams are decoded into a first predetermined channel signal and a second predetermined channel signal using the method so that a plurality of bitstream signals can be decoded into multi-channel signals having a plurality of channels.

In operation 1630, the high-frequency signal generator 1430 generates high-frequency band signals using similar low-frequency band information on each high-frequency band inputted from the bitstream interpreter 1400, feature values of each high-frequency band inputted from the inverse quantizer 1410, and a low-frequency band signal inputted from the LS-decoder 1420. The high-frequency signal generator 1430 performs operation 1630 in each channel and generates high-frequency band signals with respect to all channels.

In operation 1640, the band synthesizer 1440 synthesizes the low-frequency band signal inputted from the LS-decoder 1420 with the high-frequency band signal inputted from the high-frequency signal generator 1430 and generates decoded digital signals. The band synthesizer 1440 performs operation 1640 in each channel and generates multi-channel digital signals.

Figure 14:
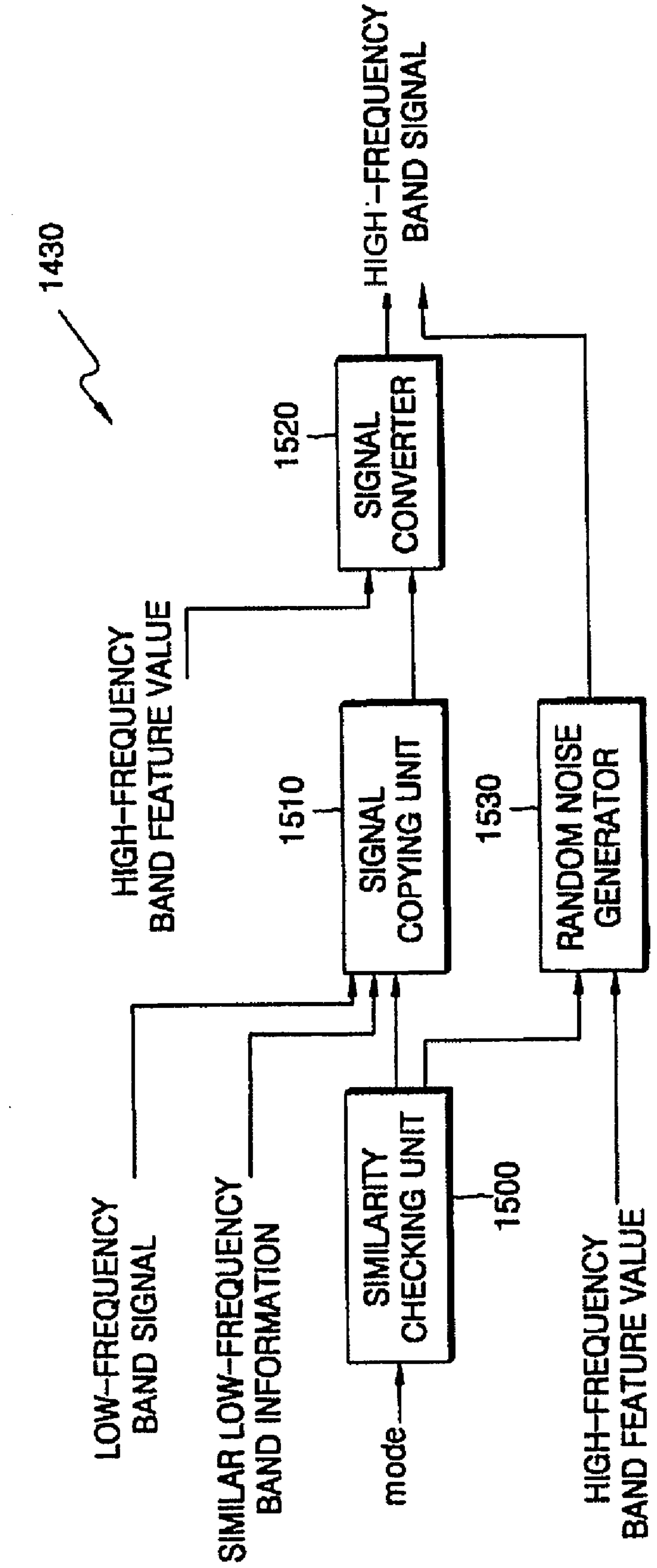
FIG. 14 is a block diagram of a high-frequency signal generator of FIG. 13 according to another embodiment of the present invention.

FIG. 14 is a block diagram of the high-frequency signal generator 1430 shown in FIG. 13 according to another embodiment of the present invention. The high-frequency signal generator 1430 includes a similarity checking unit 1500, a signal copying unit 1510, a signal converter 1520, and a random noise generator 1530.

Figure 16:
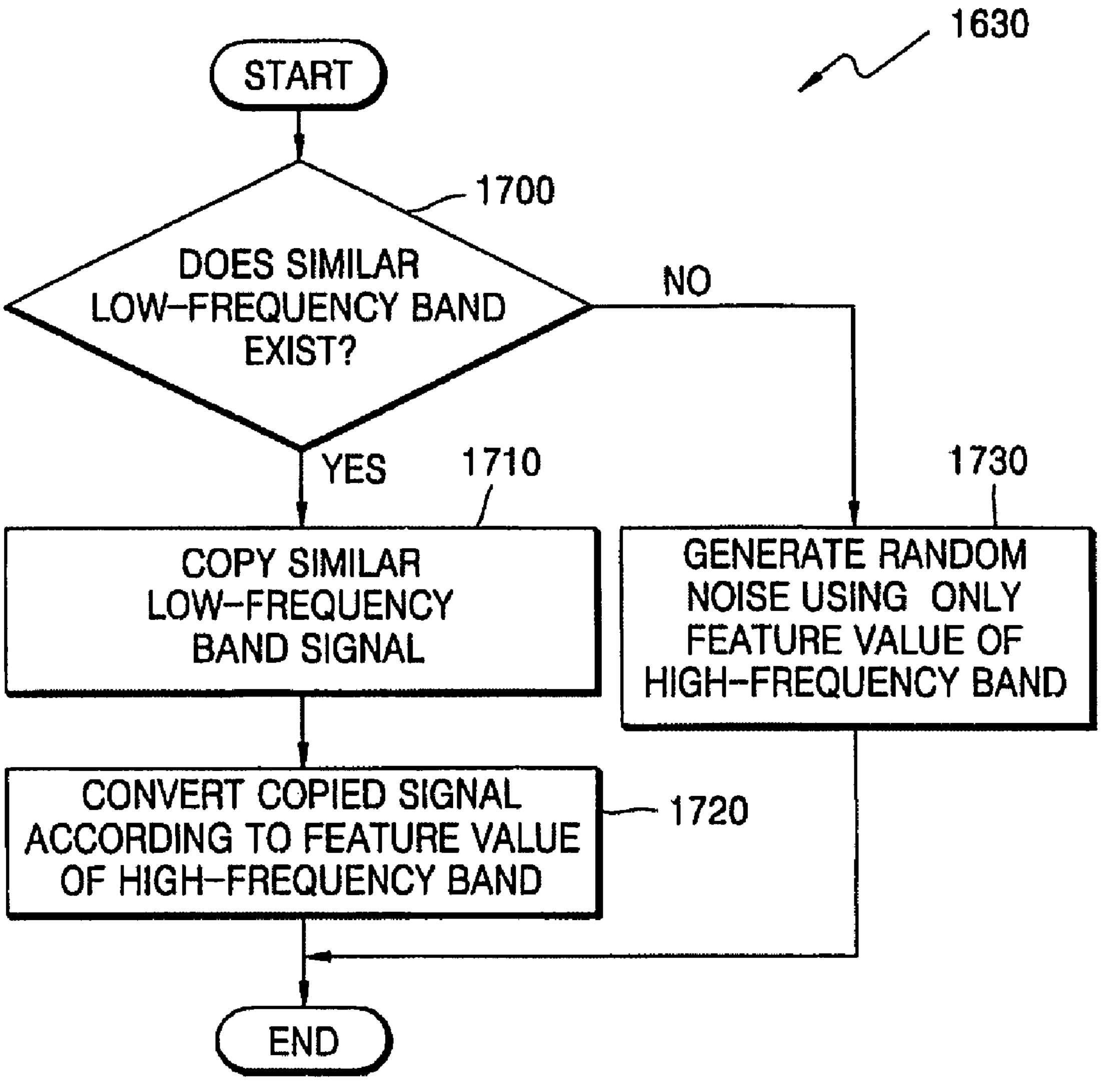
FIG. 16 is a flowchart illustrating an operation of generating a high-frequency signal of FIG. 15.

The operation of the high-frequency signal generator 1430 shown in FIG. 14 will be described in association with the flowchart shown in FIG. 16.

In operation 1700, the similarity checking unit 1500 checks whether a similar low-frequency band exists for a high-frequency band in which a signal is to be generated. When information on whether the similar low-frequency band exists in each high-frequency band is contained in bitstreams the bitstream interpreter 1400 may extract information on whether the similar low-frequency band exists in each high-frequency band from the bitstreams and the similarity checking unit 1500 may check whether a similar low-frequency band exists in each high-frequency band using the extracted information. When a mode bit with respect to a high-frequency band is “1”, the similarity checking unit 1500 may check that a low-frequency band similar to the high-frequency band exists, and when the mode bit with respect to the high-frequency band is “0”, the similarity checking unit 1500 may check that a low-frequency band similar to the high-frequency band does not exist.

In operation 1710, when the similar low-frequency band exists in a high-frequency band to be generated, the signal copying unit 1510 receives information on the similar low-frequency band and copies a low-frequency band signal corresponding to the information. In operation 1720, the signal converter 1520 receives a feature value of the high-frequency band, converts the copied signal according to the feature value of the high-frequency band and generates a signal of the high-frequency band. When the feature value is a power of the high-frequency band, the signal converter 1520 converts the copied signal to have a value of the power, and when the feature value is a scale factor of the high-frequency band, the signal converter 1520 converts the copied signal to have a value of the scale factor.

In operation 1730, when the similar low-frequency band does not exist in the high-frequency band to be generated, the random noise generator 1310 generates the signal of the high-frequency band using a random noise substitution (RNS) method. In the RNS method, the high-frequency band signal is randomly generated using only a feature value of a high-frequency band.

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet).

As described above, in the method and apparatus for encoding and decoding digital signals, multi-channel digital signals are encoded/decoded using a similarity between frequency bands and a similarity between channels such that the size of signals to be transmitted to a decoding apparatus from an encoding apparatus can be reduced while maintaining predetermined sound quality and high-frequency signals can be effectively encoded and decoded to provide stable and natural sound quality.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A method of encoding digital signals composed of at least two channels, the method comprising:

dividing a multi-channel digital signals into a predetermined number of frequency bands;

detecting a most similar or relatively similar band among low-frequency bands less than a predetermined frequency, for each high-frequency band equal to or larger the predetermined frequency among the frequency bands;

calculating a feature value from each of the high-frequency bands;

performing a first operation using a first channel signal among the multi-channel signals to generate a first signal and performing a second operation using a combination of the first channel signal and a second channel signal among the multi-channel signals to generate a second signal;

quantizing a signal that belongs to the low-frequency bands less than the predetermined frequency among the first and second signals and the calculated feature values of the high-frequency bands; and generating bitstreams using information on the detected similar low-frequency band, the quantized low-frequency band signal, and the quantized feature values of the high-frequency bands.

2. The method of claim 1, wherein the detecting of the most similar or relatively similar band among low-frequency bands comprises:

calculating a similarity between the low-frequency bands and the high-frequency bands;

detecting a low-frequency band having a largest similarity for each of the high-frequency bands; and checking whether a similarity between the detected low-frequency band and the high-frequency band is equal to or larger than a predetermined value and if the similarity is equal to or larger than the predetermined value, generating information about the detected low-frequency band.

3. The method of claim 2, further comprising, if the similarity between the detected low-frequency band and the high-frequency band is less than the predetermined value, generating information in which a similar low-frequency band does not exist.

4. The method of claim 1, wherein the similarity is a imilarity between a shape of a curve formed by values of time domain samples of the high-frequency band and the shape of a curve formed by values of time domain samples of the low-frequency band.

5. The method of claim 1, wherein the similarity is calculated by $$cor = \frac{abs\left(\sum_{i=0}^{I-1}(samp[sb_1][i]\cdot samp[sb_2][i])\right)}{\sqrt{\sum_{i=0}^{I-1}(samp[sb_1[i]\cdot samp[sb_1][i]) \sum_{i=0}^{I-1}(samp[sb_2][i]\cdot samp[sb_2][i])}}$$

wherein abs() is an absolute value of (), $sb_1$ is an index of the low-frequency band and one selected from 0 to k−1, k is the number of the low-frequency-bands, $sb_2$ is an index of the high-frequency band, I is the number of time domain samples that belong to the low-frequency band and high-frequency bands, $samp[sb_1][i]$ is an i-th time domain sample placed in an $sb_1$-th low-frequency band, and $samp[sb_2][i]$ is an i-th time domain sample placed in an $sb_2$-th high-frequency band.

6. The method of claim 1, wherein the feature value is at least one selected from a power of the high-frequency band and a scale factor.

7. The method of claim 1, wherein the first signal is the first channel signal.

8. The method of claim 1, wherein the second signal is a difference signal between the first and second channel signals.

9. The method of claim 1, wherein the generating of the first and second signals comprises:

calculating a similarity between the first channel signal and the second channel signal; and if the similarity is equal to or larger than a predetermined value, encoding the multi-channel signals into a first signal and a second signal, wherein the first signal is calculated using at least one of the first channel signal and the second channel signal, and the second signal is calculated using a combination of the first and second channel signals.

10. The method of claim 9, wherein the calculating of a similarity comprises calculating at least one among ratios of power, a scale factor, and a masking threshold between the first channel signal and the second channel signal.

11. The method of claim 10, wherein the encoding of the multi-channel signals comprises, if the calculated ratio is within a predetermined range close to 1, encoding the multi-channel signals into a first signal and a second signal.

12. The method of claim 1, further comprising allocating the number of quantized bits to the bands, wherein the quantizing comprises quantizing a signal that belongs to the low-frequency bands among the first and second signals according to the number of allocated bits.

13. A method of decoding input bitstreams into digital signals having first and second channel signals, the method comprising:

extracting a quantized low-frequency band signal, a quantized feature value of each of high-frequency bands, and information about a low-frequency band similar to each of the high-frequency bands, from the bitstreams;

inverse quantizing the quantized low-frequency band signal and the quantized feature value each of high-frequency bands;

performing a first operation using a low-frequency band signal of a first inverse-quantized bitstream to generate a low-frequency band signal of a first channel and performing a second operation using a combination of low-frequency band signals of the bitstreams to generate a low-frequency band signal of a second channel; and generating high-frequency band signals of first and second channels using the generated low-frequency band signals of the first and second channels, the inverse-quantized feature values of high-frequency bands, and the extracted information on the similar low-frequency band to each of the high-frequency bands.

14. The method of claim 13, wherein the first-channel low-frequency band signal is the inverse-quantized low-frequency band signal of the first bitstream.

15. The method of claim 13, wherein the second-channel frequency band signal is a difference signal between the inverse-quantized low-frequency band signals of the first and second bitstreams.

16. The method of claim 13, wherein the generating of high-frequency band signals comprises:

with respect to each high-frequency band, copying an inverse-quantized signal of a low-frequency band similar to the high-frequency band; and converting the copied signal into a high-frequency band signal having the inverse-quantized feature value of the high-frequency bands.

17. The method of claim 13, wherein the generating of high-frequency band signals comprises, if a similar low-frequency band corresponding to the high-frequency band does not exist, generating high-frequency band signals using only the inverse-quantized feature values of the high-frequency bands.

18. The method of claim 13, wherein the feature value of the high-frequency band is at least one of a power and a scale factor of the high-frequency band.

19. The method of claim 13, wherein the inverse quantizing comprises:

extracting a number of bits allocated to quantize each frequency band from the bitstreams; and inverse quantizing the quantized low-frequency band signal using the extracted number of bits allocated.

20. A computer readable medium on which a program for executing the method of claim 1 in a computer is recorded.

21. A computer readable medium on which a program for executing the method of claim 13 in a computer is recorded.

22. An apparatus for encoding digital signals composed of at least two channels, the apparatus comprising:

frequency band divider dividing a multi-channel digital signals into a predetermined number of frequency bands;

a similarity analyzer detecting a most similar or relatively similar band among low-frequency bands less than a predetermined frequency, for each of high-frequency bands equal to or larger the predetermined frequency among the divided frequency bands, generating bitstreams using information about the detected similar low-frequency band, and calculating a feature value from each of the high-frequency bands;

a left/side (LS)-encoder performing a first operation using a first channel signal among the multi-channel signals to generate a first signal and performing a second operation using a combination of the first channel signal and a second channel signal among the multi-channel signals to generate a second signal;

a quantizer quantizing a signal that belongs to the low-frequency bands less than the predetermined frequency among the first and second signals and the feature values of the high-frequency bands; and a bitstream generator generating bitstreams using information about the similar low-frequency band, the quantized low-frequency band signal, and the quantized feature values of the high-frequency bands.

23. The apparatus of claim 22, wherein the similarity analyzer comprises:

a band similarity calculator calculating a similarity between the low-frequency bands and the high-frequency bands;

a band detector detecting a low-frequency band having the largest similarity for each of the high-frequency bands;

a band similarity determining unit determining whether a similarity between the detected low-frequency band and the high-frequency band is equal to or larger than a predetermined value; and a similar information generator, if the similarity is equal to or larger than the predetermined value, generating bitstreams using information on the detected low-frequency band, and if the similarity is less than the predetermined value, generating information in which a similar low-frequency band does not exist.

24. The apparatus of claim 22, wherein the similarity is a similarity between a shape of a curve formed by values of time domain samples of the high-frequency band and a shape of a curve formed by values of time domain samples of the low-frequency band.

25. The apparatus of claim 22, wherein the similarity is calculated by $$cor = \frac{abs\left(\sum_{i=0}^{I-1}(samp[sb_1][i]\cdot samp[sb_2][i])\right)}{\sqrt{\sum_{i=0}^{I-1}(samp[sb_1][i]\cdot samp[sb_1][i]) \sum_{i=0}^{I-1}(samp[sb_2][i]\cdot samp[sb_2][i])}}$$

wherein abs() is an absolute value of (), $sb_1$ is an index of the low-frequency band and one selected from 0 to k−1, k is the number of the low-frequency-bands, $sb_2$ is an index of the high-frequency band, I is the number of time domain samples of the low-frequency band and high-frequency bands, $samp[sb_1][i]$ is an i-th time domain sample placed in an $sb_1$-th low-frequency band, and $samp[sb_2][i]$ is an i-th time domain sample placed in an $sb_2$-th high-frequency band.

26. The apparatus of claim 22, wherein the feature value is at least one selected from a power of the high-frequency band and a scale factor.

27. The apparatus of claim 22, wherein the first signal is the first channel signal.

28. The apparatus of claim 22, wherein the second signal is a difference signal between the first and second channel signals.

29. The apparatus of claim 22, further comprising a channel similarity analyzer calculating a similarity between the first channel signal and the second channel signal, if the similarity is equal to or larger than a predetermined value, generating a signal used to operate the LS-encoder and outputting it.

30. The apparatus of claim 29, wherein the similarity between the first and second predetermined channel signals is one among ratios of a power, a scale factor, and a masking threshold between the first channel signal and the second channel signal.

31. The apparatus of claim 22, further comprising a quantization controller allocating a number of bits allocated to the bands, wherein the quantizer quantizes a signal of the low-frequency bands among the first and second signals according to the number of allocated bits.

32. An apparatus for decoding first and second input bitstreams into digital signals having first and second channel signals, the apparatus comprising:

a bitstream interpreter extracting a quantized low-frequency band signal, a quantized feature value of each of high-frequency bands, and information on a low-frequency band similar to each of the high-frequency bands, from the first and second bitstreams;

an inverse quantizer inverse quantizing the quantized low-frequency band signal and the quantized feature values of high-frequency bands;

a left/side (LS)-decoder performing a first operation using a low-frequency band signal of a first inverse-quantized bitstream to generate a low-frequency band signal of a first channel and performing a second operation using a combination of low-frequency band signals of the first and second bitstreams to generate a low-frequency band signal of a second channel; and a high-frequency signal generator generating high-frequency band signals of first and second channels using the generated low-frequency band signals of the first and second channels, the inverse-quantized feature values of high-frequency bands, and the extracted information on the similar low-frequency band to each of the high-frequency bands.

33. The apparatus of claim 32, wherein the first-channel low-frequency band signal is the same as the inverse-quantized low-frequency band signal of the first bitstream.

34. The apparatus of claim 32, wherein the second-channel frequency band signal is a difference signal between the inverse-quantized low-frequency band signals of the first and second bitstreams.

35. The apparatus of claim 32, wherein the high-frequency signal generator comprises:

a signal copying unit receiving the inverse-quantized low-frequency band signal and information about a similar low-frequency band corresponding to the high-frequency band and copying a signal of a low-frequency band similar to each high-frequency band; and signal converter receiving the copied signal and the inverse-quantized feature value of the high-frequency band and converting the copied signal into a high-frequency band signal having the inverse-quantized feature value with respect to each high-frequency band.

36. The apparatus of claim 32, wherein the high-frequency signal generator generates high-frequency band signals using only the inverse-quantized feature values of the high-frequency bands if a similar low-frequency band corresponding to the high-frequency band does not exist.

37. The apparatus of claim 32, wherein the feature value of the high-frequency band is at least one of a power and a scale factor of the high-frequency band.

38. The apparatus of claim 32, wherein the bitstream interpreter extracts a quantized low-frequency band signal, a quantized feature value of each of high-frequency bands, and information about a low-frequency band similar to each of the high-frequency bands and a number of bits allocated to quantize each frequency band from the first and second bitstreams, and the inverse quantizer inverse quantizes the quantized low-frequency band signal using the number of bits allocated.

39. The apparatus of claim 32, further comprising:

band synthesizer to synthesize the low-frequency band signal inputted from the LS-decoder with the high-frequency band signal from the high frequency signal generator and generate a decoded digital signal.

40. The apparatus of claim 36, wherein the high-frequency signal generator to generate the high frequency band signal using a random noise substitution (RNS) method.

41. A method of decoding bitstreams into digital signals having first and second channel signals, the method comprising:

extracting a quantized low-frequency band signal, a quantized feature value of each of high-frequency bands, and information on a low-frequency band similar to each of the high-frequency bands, from the bitstreams;

inverse quantizing the quantized low-frequency band signal and the quantized feature values of each high-frequency bands;

decoding the inverse quantized low-frequency band signal to generate a low-frequency band signal of a first channel;

generating a low-frequency band signal of a second channel using a combination of low-frequency band signals of the first and second channel; and generating high-frequency band signals of first and second channels using the generated low-frequency band signals of the first and second channels, the inverse-quantized feature values of high-frequency bands, and the extracted information on the similar low-frequency band to each of the high-frequency bands.

* * * * *

UNITED STATES PATENT AND TRADEMARK OFFICE
CERTIFICATE OF CORRECTION

PATENT NO. : 7,245,234 B2
APPLICATION NO. : 11/334524
DATED : July 17, 2007
INVENTOR(S) : Dohyung Kim et al.

It is certified that error appears in the above-identified patent and that said Letters Patent is hereby corrected as shown below:

Title Page, Column 2 item 57 (Abstract), Line 4, after "channels." change "multi-channel" to --Multi-channel--.

Column 15, Line 26, before "between" change "imilarity" to --similarity--.

Signed and Sealed this

Eighteenth Day of December, 2007

JON W. DUDAS
*Director of the United States Patent and Trademark Office*